(12) United States Patent
Chen et al.

(10) Patent No.: US 7,919,195 B2
(45) Date of Patent: Apr. 5, 2011

(54) SYSTEM FOR DISPLAYING IMAGES

(75) Inventors: Liang-Jyi Chen, Taipei (TW); Hsiang-Lun Hsu, Miaoli County (TW)

(73) Assignee: Chimei Innolux Corporation, Miao-Li County (TW)

( * ) Notice: Subject to any disclaimer, the term of this patent is extended or adjusted under 35 U.S.C. 154(b) by 827 days.

(21) Appl. No.: 11/622,020

(22) Filed: Jan. 11, 2007

(65) Prior Publication Data

US 2008/0171228 A1    Jul. 17, 2008

(51) Int. Cl.
*C09K 11/06* (2006.01)
*H01L 51/54* (2006.01)
*B32B 9/00* (2006.01)

(52) U.S. Cl. .......... 428/690; 428/917; 313/502; 257/40; 257/E51.001

(58) Field of Classification Search ............... None
See application file for complete search history.

(56) References Cited

U.S. PATENT DOCUMENTS

| | | | | |
|---|---|---|---|---|
| 4,960,886 A | * | 10/1990 | Mukai et al. | 544/35 |
| 5,364,654 A | * | 11/1994 | Hosokawa et al. | 427/66 |
| 2003/0230980 A1 | | 12/2003 | Forrest et al. | |
| 2004/0146744 A1 | * | 7/2004 | Seo et al. | 428/690 |
| 2004/0241492 A1 | | 12/2004 | Tokuda et al. | |
| 2005/0052127 A1 | * | 3/2005 | Sakata et al. | 313/506 |

FOREIGN PATENT DOCUMENTS

| | | |
|---|---|---|
| CA | 2492222 | 7/2005 |
| CN | 1826840 | 8/2006 |
| WO | WO03107452 | 12/2003 |
| WO | WO 2006/081780 | 8/2006 |

OTHER PUBLICATIONS

Kobayashi et al. J. Chem. Soc. Chem. Commun. 1986, 1779-1780. Year of publication 1986.*
Takahashi et al. J. Org. Chem. 2000, 65, 2577-2579. Date of publication Mar. 18, 2000.*
"Low-Voltage Organic Electroluminescent Devices Using Pin Structures" Huang et al., Jan. 2002, pp. 139-141.
Chinese language office action dated Jun. 17, 2010.

* cited by examiner

*Primary Examiner* — D. Lawrence Tarazano
*Assistant Examiner* — Andrew K Bohaty
(74) *Attorney, Agent, or Firm* — Thomas/Kayden

(57) ABSTRACT

Systems for displaying images. An exemplary embodiment of a system comprises an organic electroluminescent diode, having a hole injection layer. The hole injection layer comprises compounds having the structure showing in formula

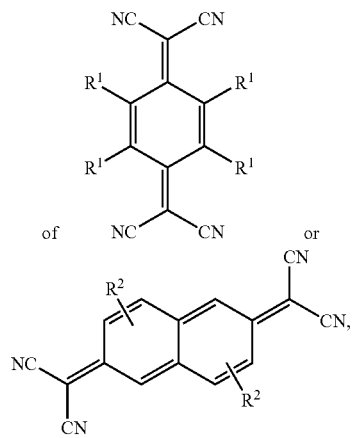

wherein at least one of two adjacent $R^1$ groups link together with the carbon atoms to which they are attached to form a saturated ring system having from 4 to 20 atoms, and remaining $R^1$ and $R^2$ are the same or different and comprise hydrogen or halogen atom.

9 Claims, 2 Drawing Sheets

SYSTEM FOR DISPLAYING IMAGES

BACKGROUND OF THE INVENTION

1. Field of the Invention

The invention relates to a system for displaying images and, more particularly, to a system for displaying images including organic electroluminescent diode.

2. Description of the Related Art

Organic electroluminescent diodes are self-emitting and highly luminous, have a wide viewing angle, faster response, and a simple fabrication process, making them an industry display of choice. Recently, with the development and wide application of electronic products such as mobile phones, personal digital assistants, and notebook computers, there has been an increased demand for flat display devices which consume less power and occupy less space.

Conventional organic electroluminescent diodes, however, generally rely on intrinsic semiconductor materials and have undoped hole injection layers, exhibit higher driving voltage and power consumption in comparison with the same type of liquid crystal display (LCD). In order to reduce the driving voltage and power consumption of organic electroluminescent diodes, an OLED having a p-i-n structure is described in Huang et al., Low Voltage Organic Electroluminescent Devices Using pin Structures, Applied Physics Letters, Vol. 80, No. 1, pp 139-141 (2002). In particular, the OLED has a p-doped hole injection layers.

Stephen R. Forrest disclosed a p-i-n OLED using F4-TCNQ (2,3,5,6-tetrafluoro-7,7,8,8-tetracyano-p-quinodimethane) as p-dopant and m-MTDATA (4,4',4"-tris(3-methylphenylphenylamino)-triphenylamine) as host of a p-doped layer to achieve a driving voltage of not more than about 2 volts at a current density of 100 cd/m2. Because the F4-TCNQ has low thermal stability and is apt to be decomposed during evaporation, the reliability and performance of the OLED is reduced. Further, due to the low deposition temperature of F4-TCNQ, the dopant amount of the F4-TCNQ is difficult to control.

Therefore, it is necessary to develop a p-i-n OLED employing a novel material with improved thermal stability and optoelectronic characteristics to serve as p-dopant in order to accommodate wide use.

BRIEF SUMMARY OF THE INVENTION

Systems for displaying images are provided. An exemplary embodiment of a system comprises an organic electroluminescent diode, having a hole injection layer. The hole injection layer comprises compounds having the structure shown in formula (I), and (II):

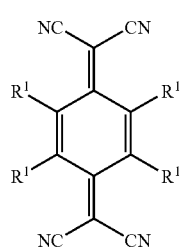

formula (I)

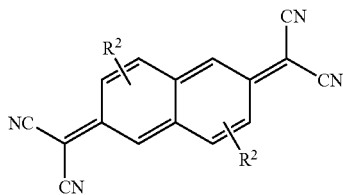

formula (II)

At least one of two adjacent $R^1$ groups link together with the carbon atoms to which they are attached to form a saturated ring system having from 4 to 20 atoms, and remaining $R^1$ and $R^2$ are the same or different and comprise hydrogen or halogen atom. Further, the saturated ring system can be selected from the group consisting of the benzenic group, thenyl group, pyrrol group, furan group, sulfur-containing cyclic group, and dithiin ring. Optionally at least one hydrogen atom bonded to the carbon atom of the saturated ring system can be substituted by a halogen atom.

Another exemplary embodiment of the system comprises an organic electroluminescent diode, comprising an anode, electroluminescent layers formed on the anode, and a cathode formed on the electroluminescent layers. The electroluminescent layers comprises a p-doped hole injection layer formed directly on the anode. The p-doped hole injection layer comprises compounds having the structure shown in formula (I) or (II) serving as a p-dopant.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
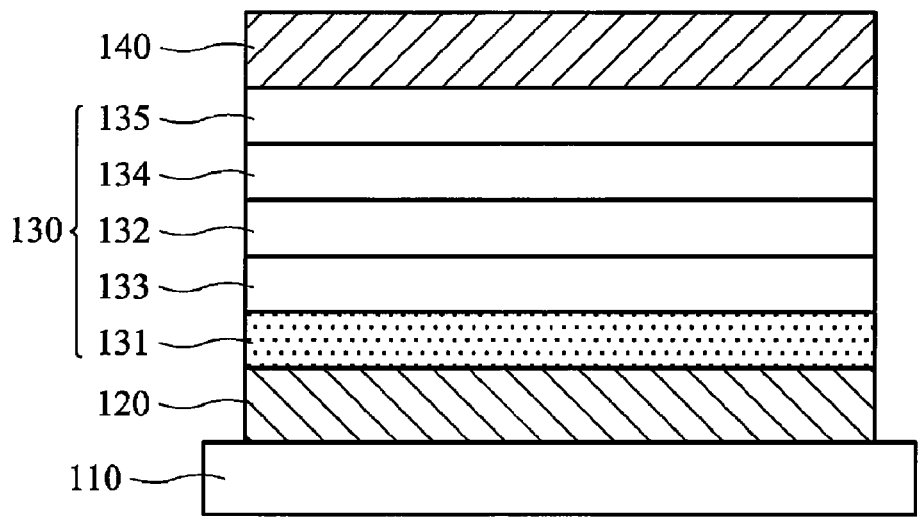
FIG. 1 shows a cross section of an embodiment of an organic electroluminescent diode of the invention.

FIG. 1 is a cross section of a organic electroluminescent diode 100 according to an embodiment of the invention. The organic electroluminescent diode 100 comprises a substrate 110 of an insulating material such as glass, plastic, or ceramic. Further, the substrate 110 can be a semiconductor substrate, transparent or optionally opaque, specifically a transparent substrate when the organic electroluminescent diode 100 is a bottom-emission or dual emission organic electroluminescent device, and an opaque substrate when the organic electroluminescent diode 100 is a top-emission organic electroluminescent device.

A first electrode such as an anode electrode 120 is formed on the substrate 110, and can be a transparent electrode, metal electrode, or combinations thereof, comprising indium tin oxide (ITO), indium zinc oxide (IZO), aluminum zinc oxide (AZO), zinc oxide (ZnO), Li, Mg, Ca, Al, Ag, In, Au, Ni, Pt, or alloys thereof, formed by a method such as sputtering, electron beam evaporation, thermal evaporation, or chemical vapor deposition.

An electroluminescent layer 130 is formed on the anode electrode 120, wherein the electroluminescent layer 130 at least comprises a p-doped hole injection layer 131 and a light emitting layer 132, and can further comprise a hole transport layer 133, an electron transport layer 134, and an electron injection layer 135, as shown in FIG. 1. The electroluminescent layer 130 is an organic semiconductor material such as a small molecule material, polymer, or organometallic complex, and can be formed by thermal vacuum evaporation, spin coating, dip coating, roll-coating, injection-fill, embossing, stamping, physical vapor deposition, or chemical vapor deposition. The light emitting layer 132 can comprise a light-emitting material and an electroluminescent dopant doped into the light-emitting material and can perform energy transfer or carrier trapping under electron-hole recombination in the emitting layer. The light-emitting material can be fluorescent or phosphorescent. Particularly, the p-doped hole injection layer 131 has a p-dopant and a hole injection material serving as a host, wherein the p-dopant is doped into the hole injection material. The hole injection layer can comprise compounds having the structure (showing in formula (I), (II), and (III)) serving as the p-dopant.

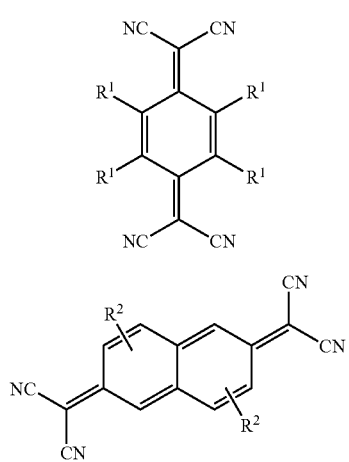

formula (I)

formula (II)

At least one of two adjacent $R^1$ groups link together with the carbon atoms to which they are attached to form a saturated ring system having from 4 to 20 atoms, and remaining $R^1$ and $R^2$ are the same or different and comprise hydrogen or halogen atom. Further, the saturated ring system can be selected from the group consisting of benzenic group, thenyl group, pyrrol group, furan group, sulfur-containing cyclic group, and dithiin ring. Optionally at least one hydrogen atom bonded to the carbon atom of the saturated ring system can be substituted by a halogen atom.

Moreover, the compounds having the structure shown in formula (I) can be cyano-substituted derivatives, such as

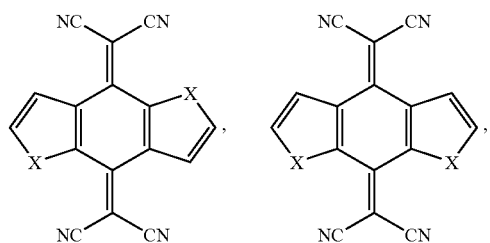

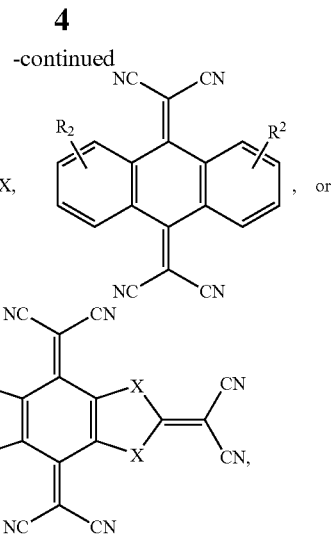

wherein X is independent and can be O, N—$R^3$, or S, and $R^2$, and $R^3$ is hydrogen or halogen atom. Further, the compounds having the structure shown in formula (I) also can be cyano-substituted derivatives, such as,

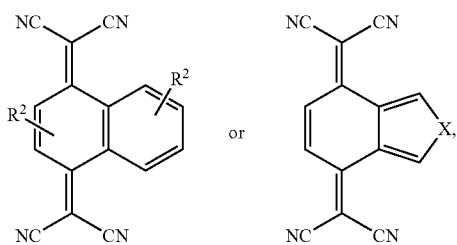

wherein X is independent and can be O, N—$R^3$, or S, and $R^2$, and $R^3$ is hydrogen or halogen atom.

A second electrode 140 serving as a cathode is formed on the electroluminescent layers 130 (such as the electron injection layer 135). The second electrode 140 (cathode) is capable of injecting electrons into the electroluminescent layers 130 (via the electron injection layer 135), for example, a low work function material such as Ca, Ag, Mg, Al, Li, or alloys thereof, formed by sputtering, electron beam evaporation, thermal evaporation, or chemical vapor deposition.

The following examples are intended to illustrate the invention more fully without limiting their scope, since numerous modifications and variations will be apparent to those skilled in this art.

Synthesis of P-dopant

EXAMPLE 1

Synthesis of

Compound (A)

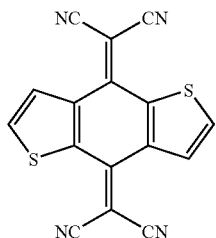

First, 0.635 g of 4,8-Bis(dicyanomethylene)-4.8-dihydrobenzo[1,2-b:4,5-b']diththiophene-4,8-dione, 3.8 g of malononitrile, and 10 ml pyridine were added into a bottle and dissolved with 200 ml chloroform. After adding 0.8 ml of $TiCl_4$ into the bottle, the mixture was heated and refluxed for 5 hours with stirring. After cooling, the resulting mixture was subjected to extraction, thus filtered, extracted, condensed, and dried, to provide an organic compound (A) with red color having a melt point of 332° C.

Fabrication of Organic Electroluminescent Diode

COMPARATIVE EXAMPLE 1

A glass substrate with an indium tin oxide (ITO) film of 100 nm in thickness was provided and then washed by a cleaning agent, acetone, and isopropanol with ultrasonic agitation. After drying with nitrogen flow, the ITO film was subjected to uv/ozone treatment. Next, a hole injection layer, hole transport layer, light-emitting layer, electron transport layer, electron injection layer, and aluminum electrode were subsequently formed on the ITO film at $10^{-5}$ Pa, obtaining the organic electroluminescent diode (1) after encapsulation. For purposes of clarity, the materials and layers formed therefrom are described in the following.

The hole injection layer, with a thickness of 1500 nm, consisted of HI 406 (manufactured and sold by Idemitsu Co., Ltd). The hole transport layer, with a thickness of 20 nm, consisted of NPB (N,N'-di-1-naphthyl-N,N'-diphenyl-1,1'-biphenyl-1,1'-biphenyl-4,4'-diamine). The light-emitting layer, with a thickness of 31 nm, consisted of BH120 (manufactured and sold by Idemitsu Co., Ltd.) doped with BD102 (manufactured and sold by Idemitsu Co., Ltd.)(BH120/BD102=100 Å/3.5 Å) and BH120 doped with RD01 (manufactured and sold by Idemitsu Co., Ltd.) (BH120/RD01=200 Å/7 Å). The electron transport layer, with a thickness of 13 nm, consisted of (tris (8-hydroxyquinoline) aluminum). The electron injection layer, with a thickness of 1 nm, consisted of LiF. The aluminum electrode had a thickness of 150 nm.

The optical properties of organic electroluminescent diode (1), as described in Comparative Example 1, were measured by PR650 (purchased from Photo Research Inc.) and Minolta LS110. The measured results were shown in Table 1 and FIG. 2.

COMPARATIVE EXAMPLE 2

A glass substrate with an indium tin oxide (ITO) film of 100 nm in thickness was provided and then washed by a cleaning agent, acetone, and isopropanol with ultrasonic agitation. After drying with nitrogen flow, the ITO film was subjected to uv/ozone treatment. Next, a p-doped hole injection layer, hole transport layer, light-emitting layer, electron transport layer, electron injection layer, and aluminum electrode were subsequently formed on the ITO film at $10^{-5}$ Pa, obtaining the organic electroluminescent diode (2) after encapsulating. For purposes of clarity, the materials and layers formed therefrom are described in the following.

The p-doped hole injection layer, with a thickness of 1500 nm, consisted of F4-TCNQ as dopant, and HI 406 as hole-injection material host, wherein the weight ratio between F4-TCNQ and HI 406 was 100:2.5. The hole transport layer, with a thickness of 20 nm, consisted of NPB (N,N'-di-1-naphthyl-N,N'-diphenyl-1,1'-biphenyl-1,1'-biphenyl-4,4'-diamine). The light-emitting layer, with a thickness of 31 nm, consisted of BH120 (manufactured and sold by Idemitsu Co., Ltd.) doped with BD102 (manufactured and sold by Idemitsu Co., Ltd.)(BH120/BD102=100 Å/3.5 Å) and BH120 doped with RD01 (manufactured and sold by Idemitsu Co., Ltd.) (BH120/RD01=200 Å/7 Å). The electron transport layer, with a thickness of 13 nm, consisted of (tris (8-hydroxyquinoline) aluminum). The electron injection layer, with a thickness of 1 nm, consisted of LiF. The aluminum electrode had a thickness of 150 nm.

The optical properties of organic electroluminescent diode (2), as described in Comparative Example 2, were measured by PR650 (purchased from Photo Research Inc.) and Minolta LS110. The measured results were shown in Table 1 and FIG. 2.

EXAMPLE 2

A glass substrate with an indium tin oxide (ITO) film of 100 nm in thickness was provided and then washed by a cleaning agent, acetone, and isopropanol with ultrasonic agitation. After drying with nitrogen flow, the ITO film was subjected to uv/ozone treatment. Next, a p-doped hole injection layer, hole transport layer, light-emitting layer, electron transport layer, electron injection layer, and aluminum electrode were subsequently formed on the ITO film at $10^{-5}$ Pa, obtaining the organic electroluminescent diode (3) after encapsulating. For purposes of clarity, the materials and layers formed therefrom are described in the following.

The p-doped hole injection layer, with a thickness of 1500 nm, consisted of organic compound (A) (as synthesized in Example 1) as dopant, and HI406 (Idemitsu) as hole-injection material host, wherein the weight ratio of the organic compound (A) was 4%. The hole transport layer, with a thickness of 20 nm, consisted of NPB (N,N'-di-1-naphthyl-N,N'-diphenyl-1,1'-biphenyl-1,1'-biphenyl-4,4'-diamine). The light-emitting layer, with a thickness of 31 nm, consisted of BH120:BD102 (100:3.5 Å)/BH120:RD01 (200:7.5 Å). The electron transport layer, with a thickness of 13 nm, consisted of (tris (8-hydroxyquinoline) aluminum). The electron injection layer, with a thickness of 1 nm, consisted of LiF. The aluminum electrode had a thickness of 150 nm.

The optical properties of organic electroluminescent diode (3), as described in Comparative Example 2, were measured by PR650 (purchased from Photo Research Inc.) and Minolta LS110. The measured results were shown in Table 1 and FIG. 2.

TABLE 1

| Organic electroluminescent diode | Turn-on voltage(V) | Brightness (max, $cd/m^2$) | Efficiency (cd/A) |
|---|---|---|---|
| Comparative Example 1 (no dopant) | 6 | 3100 | 4.69 |
| Comparative Example 2 (doping F4-TCNQ) | 5 | 3100 | 6.04 |
| Example 2 (doping organic compound (1)) | 4 | 14000 | 6.54 |

Figure 2:
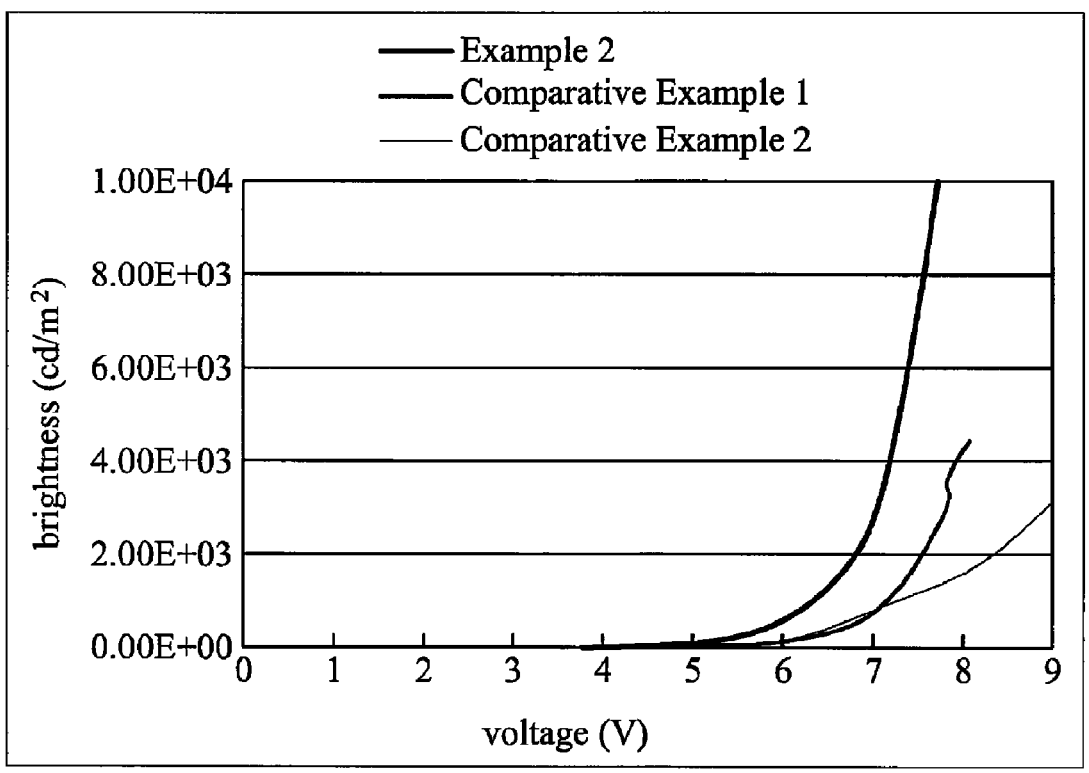
FIG. 2 shows a graph plotting voltage against brightness of the electroluminescent devices as disclosed in Comparative Examples 1~2 and Example 2.

FIG. 2 illustrates a graph plotting operating voltage against brightness of the organic electroluminescent diodes (1~3). Referring to FIG. 2 and Table 1, the organic electroluminescent diode (3) (Example 2) has a lower driving voltage less than the organic electroluminescent diode (2) (Comparative Example 2).

Since the specific dopant, for example, the above-mentioned compound (A), of the hole injection layer of the embodiment of the present invention exhibits high thermal stability and high deposition temperature (more than 170° C.), the organic electroluminescent diodes employing the specific dopant have improved reliability and performance.

Further, due to the high deposition temperature of the specific dopant, the doping amount thereof is apt to be controllable.

Figure 3:
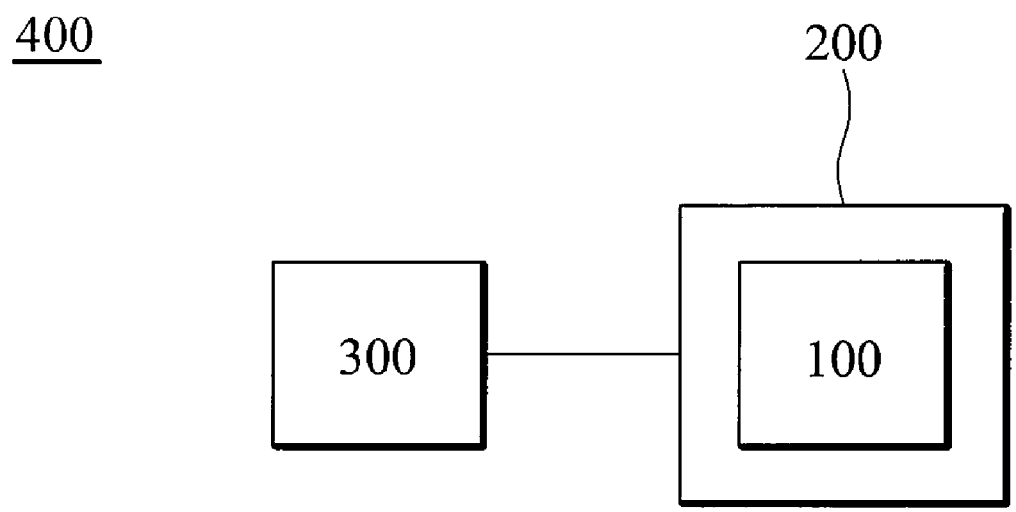
FIG. 3 schematically shows another embodiment of a system for displaying images.

FIG. 3 schematically shows another embodiment of a system for displaying images which, in this case, is implemented as a display panel 200 or an electronic device 400. The described organic electroluminescent diode can be incorporated into a display panel that can be an OLED panel. As shown in FIG. 3, the display panel 200 comprises an organic electroluminescent diode, such as the organic electroluminescent diode 100 shown in FIG. 1. The display panel 200 can form a portion of a variety of electronic devices (in this case, electronic device 400). Generally, the electronic device 400 can comprise the display panel 200 and an input unit 300. Further, the input unit 300 is operatively coupled to the display panel 200 and provides input signals (e.g., an image signal) to the display panel 200 to generate images. The electronic device 400 can be a mobile phone, digital camera, personal digital assistant (PDA), notebook computer, desktop computer, television, car display, or portable DVD player, for example.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
    an organic electroluminescent diode having a hole injection layer, wherein the hole injection layer comprises compounds of:

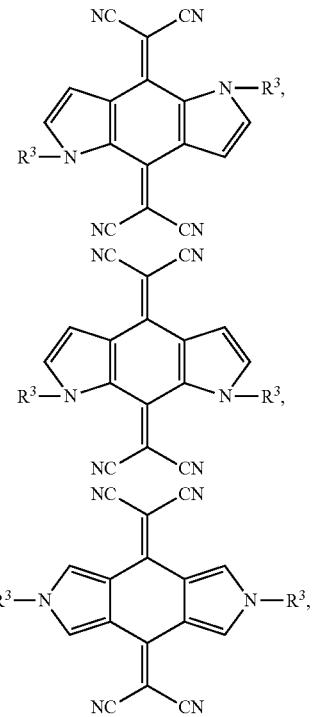

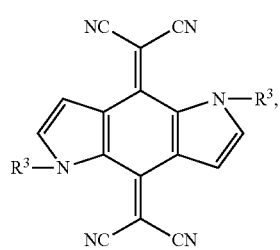

wherein X is independently selected from O, N—$R^3$, or S and $R^3$ is hydrogen or halogen atom.

2. The system as claimed in claim 1, wherein the compound having a formula (I) serves as a p-dopant of the hole injection layer.

3. The system as claimed in claim 1, further comprising an anode, wherein the hole injection layer contacts the anode.

4. The system as claimed in claim 1, wherein the compound having a formula (I) has a deposition temperature of more than 150° C.

5. The system as claimed in claim 1, wherein the organic electroluminescent diode is a p-i-n organic electroluminescent diode.

6. The system as claimed in claim 1, further comprising a display panel, wherein the organic electroluminescent diode forms a portion of the display panel.

7. The system as claimed in claim 4, further comprising an electronic device, wherein the electronic device comprises:
    the display panel; and
    an input unit coupled to the display panel and operative to provide input to the display panel such that the display panel displays images.

8. The system as claimed in claim 5, wherein the electronic device is a mobile phone, digital camera, PDA (personal data assistant), notebook computer, desktop computer, television, car display, or portable DVD player.

9. A system for displaying images, comprising:
    an organic electroluminescent diode comprising:
    an anode;
    electroluminescent layers formed on the anode; and
    a cathode,
    wherein the electroluminescent layers comprises a p-doped hole injection layer formed directly on the anode, comprises compounds of:

-continued
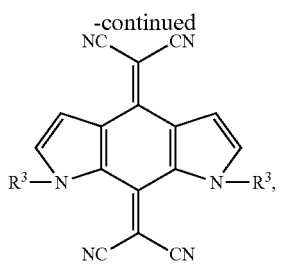
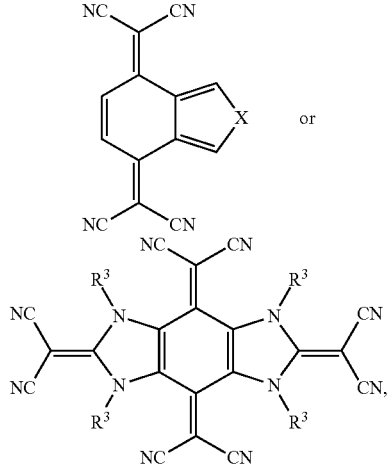
wherein X is independently selected from O, N—$R^3$, or S, and $R^3$ is hydrogen or halogen atom.
* * * * *